US009844926B2

(12) United States Patent
Asano et al.

(10) Patent No.: US 9,844,926 B2
(45) Date of Patent: Dec. 19, 2017

(54) INORGANIC FILM AND LAMINATE

(71) Applicant: SEKISUI CHEMICAL CO., LTD., Osaka, Osaka (JP)

(72) Inventors: Motohiko Asano, Osaka (JP); Hiroaki Okuyama, Osaka (JP); Masahiro Asuka, Kyoto (JP)

(73) Assignee: SEKISUI CHEMICAL CO., LTD., Osaka (JP)

( * ) Notice: Subject to any disclaimer, the term of this patent is extended or adjusted under 35 U.S.C. 154(b) by 358 days.

(21) Appl. No.: 14/653,774

(22) PCT Filed: Jun. 27, 2014

(86) PCT No.: PCT/JP2014/067187
§ 371 (c)(1),
(2) Date: Jun. 18, 2015

(87) PCT Pub. No.: WO2015/002089
PCT Pub. Date: Jan. 8, 2015

(65) Prior Publication Data
US 2015/0321455 A1    Nov. 12, 2015

(30) Foreign Application Priority Data

Jul. 1, 2013    (JP) ................................. 2013-138161
Jan. 8, 2014   (JP) ................................. 2014-001597

(51) Int. Cl.
*B32B 27/06*   (2006.01)
*B32B 7/02*    (2006.01)
(Continued)

(52) U.S. Cl.
CPC ................ *B32B 27/06* (2013.01); *B32B 7/02* (2013.01); *B32B 27/08* (2013.01); *B32B 27/32* (2013.01);
(Continued)

(58) Field of Classification Search
CPC ........ C08J 7/042; C23C 14/562; C23C 14/10; C23C 14/086; C23C 14/081;
(Continued)

(56) References Cited

U.S. PATENT DOCUMENTS 4,440,822 A    4/1984   Gordon
5,168,003 A *  12/1992  Proscia ............... C03C 17/3417
                                                     359/586

(Continued)

FOREIGN PATENT DOCUMENTS

CN         1568346 A    1/2005
CN       101432638 A    5/2009
(Continued)

OTHER PUBLICATIONS

Written Opinion of the International Searching Authority (PCT/ISA/237) for Application No. PCT/JP2014/067187 dated Sep. 22, 2014 (English Translation mailed Jan. 14, 2016).
(Continued)

*Primary Examiner* — Prashant J Khatri
(74) *Attorney, Agent, or Firm* — Cheng Law Group, PLLC

(57) ABSTRACT

There are provided an inorganic film in which the light transmittance is not decreased also when the inorganic film is laminated on organic material such as a resin, and a laminate. An inorganic film 13 which comprises a refractive index gradient film 13a having a refractive index changing continuously from n1 to n2 (n1<n2) and being a functional film; and a refractive index gradient film 13b having a refractive index changing continuously from n3 to n4 (n4<n3) and being a functional film, and in which further, a difference between n2 and n3 is 0.1 or less.

7 Claims, 2 Drawing Sheets

(51) Int. Cl.
| | |
|---|---|
| *B32B 27/32* | (2006.01) |
| *C23C 14/10* | (2006.01) |
| *C23C 14/08* | (2006.01) |
| *C23C 14/00* | (2006.01) |
| *C08J 7/04* | (2006.01) |
| *B32B 27/08* | (2006.01) |
| *C23C 14/02* | (2006.01) |
| *C23C 14/56* | (2006.01) |
| *G02B 1/113* | (2015.01) |

(52) U.S. Cl.
CPC ............ *B32B 27/322* (2013.01); *C08J 7/042* (2013.01); *C23C 14/0084* (2013.01); *C23C 14/024* (2013.01); *C23C 14/08* (2013.01); *C23C 14/081* (2013.01); *C23C 14/086* (2013.01); *C23C 14/10* (2013.01); *C23C 14/562* (2013.01); *B32B 2307/412* (2013.01); *B32B 2307/418* (2013.01); *B32B 2307/712* (2013.01); *B32B 2307/7242* (2013.01); *B32B 2307/7246* (2013.01); *C08J 2367/02* (2013.01); *G02B 1/113* (2013.01); *Y10T 428/24942* (2015.01)

(58) Field of Classification Search
CPC ... C23C 14/024; C23C 14/08; C23C 14/0084; B32B 7/02; B32B 27/06; B32B 27/322; Y10T 428/24942; G02B 1/113
See application file for complete search history.

(56) References Cited

U.S. PATENT DOCUMENTS

| | | | |
|---|---|---|---|
| 5,248,545 A | 9/1993 | Proscia | |
| 2005/0101698 A1 | 5/2005 | Harada et al. | |
| 2009/0091825 A1 | 4/2009 | Saito et al. | |
| 2010/0136331 A1 | 6/2010 | Fahland et al. | |
| 2012/0168301 A1 | 7/2012 | Fahland et al. | |

FOREIGN PATENT DOCUMENTS

| | | |
|---|---|---|
| CN | 101493533 A | 7/2009 |
| CN | 101866956 A | 10/2010 |
| CN | 102667535 A | 9/2012 |
| JP | 5-193995 A | 8/1993 |
| JP | 7-41337 A | 2/1995 |
| JP | 2007-316595 A | 12/2007 |
| JP | 2010-137447 A | 6/2010 |
| JP | 2010-524732 A | 7/2010 |

OTHER PUBLICATIONS

Korean Office Action for the Application No. 10-2015-7016576 dated Sep. 9, 2016.

The First Office Action for the Application No. 201480003177.5 from The State Intellectual Property Office of the People's Republic of China dated Nov. 2, 2016.

International Search Report for the Application No. PCT/JP2014/067187 dated Sep. 22, 2014.

Written Opinion of the International Searching Authority (PCT/ISA/237) for Application No. PCT/JP2014/067187 dated Sep. 22, 2014.

\* cited by examiner

[FIG. 1]
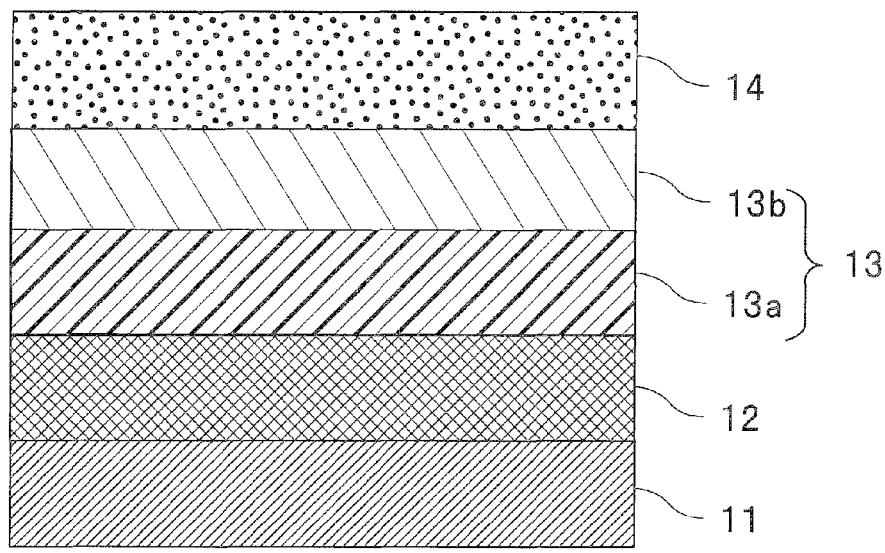
[FIG. 2]
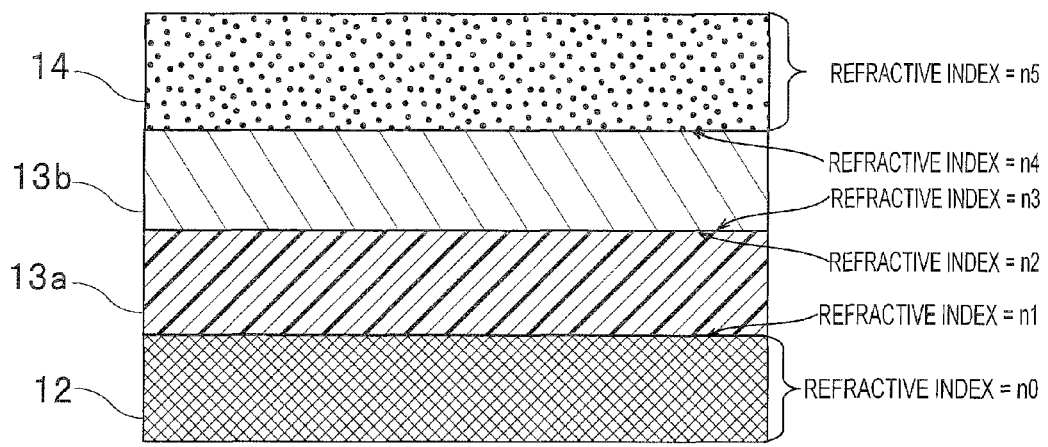

[FIG. 3]
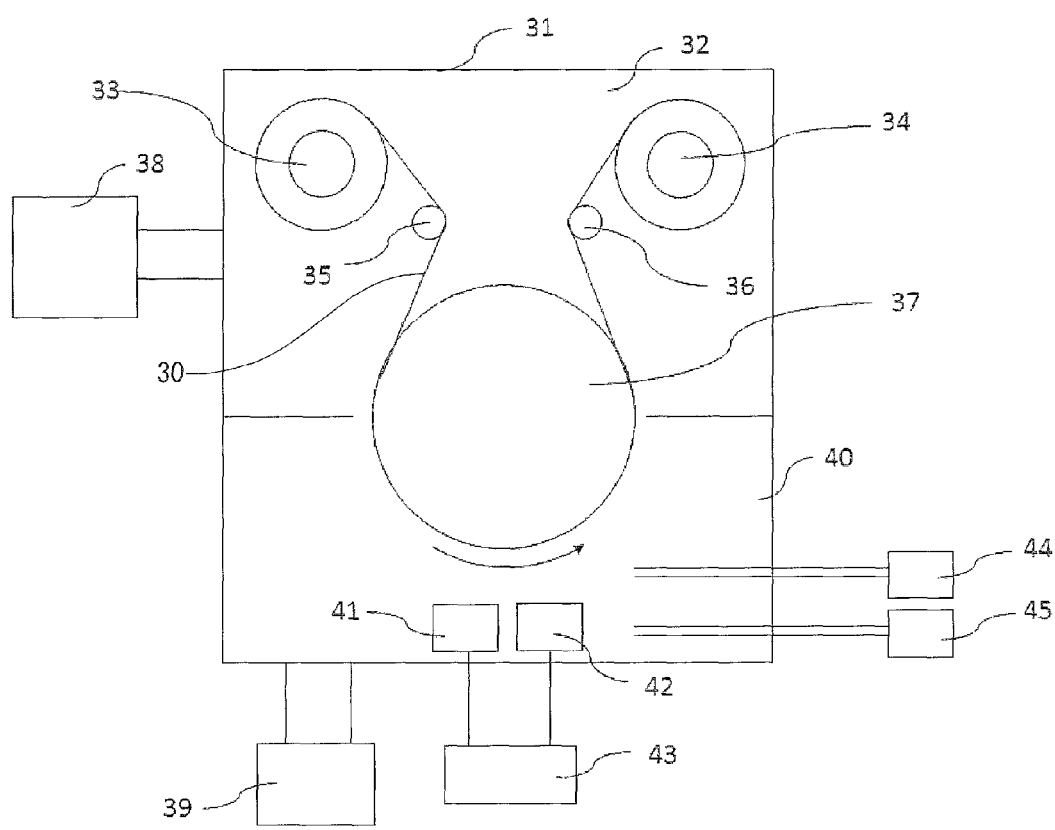

US 9,844,926 B2

INORGANIC FILM AND LAMINATE

TECHNICAL FIELD

The present invention relates to an inorganic film which has a high refractive index and in which optical interference is suppressed, and a laminate obtained by laminating the inorganic film on organic material such as a resin.

BACKGROUND ART

In a flexible device that is lightweight and can be freely bent, organic material such as a resin is used for the substrate and the element itself. In the so-called flexible device using a flexible substrate comprising a resin or the like as a substrate, a gas barrier film having flexibility in addition to gas barrier properties and transparency is required as a sealing member.

Patent Literature 1 discloses a gas barrier film having both gas barrier properties and flexibility. In Patent Literature 1, zinc tin oxide is used in order to increase the gas barrier properties.

CITATION LIST

Patent Literature

Patent Literature 1: National Publication in Japan of International Patent Application No. 2010-524732

SUMMARY OF INVENTION

Technical Problem

However, the zinc tin oxide disclosed in Patent Literature 1 has a high refractive index, and when the zinc tin oxide is provided on resin materials such as a substrate film, and an anchor coat layer, the refractive index difference between the zinc tin oxide and the materials causes optical interference. Therefore, a problem is that the light transmittance decreases.

It is an object of the present invention to provide an inorganic film in which the light transmittance is not decreased even when the inorganic film is laminated on organic material such as a resin, and a laminate having the inorganic film.

Solution to Problem

An inorganic film according to the present invention comprises a refractive index gradient film A being composed of an inorganic material, having a refractive index changing continuously from n1 to n2 (n1<n2) from one surface toward the other surface, and being a functional film; and a refractive index gradient film B being composed of an inorganic material, having a refractive index changing continuously from n3 to n4 (n4 <n3) from one surface toward the other surface, and being a functional film; the refractive index gradient film B being laminated on a surface of the refractive index gradient film A on a side where the refractive index is n2 with a surface side where the above refractive index is n3 being in direct or indirect contact with the surface of the refractive index gradient film A; a difference between n2 and n3 being 0.1 or less; the inorganic material being a complex oxide comprising Zn, Sn, and at least one of Si and Al.

In the inorganic film according to the present invention, preferably, at least one of the refractive index gradient film A and the refractive index gradient film B comprises a complex oxide comprising Si, Zn, and Sn.

In the inorganic film according to the present invention, preferably, in the complex oxide comprising Si, Zn, and Sn, a ratio Xs between Sn and a sum of Zn and Sn satisfies 70>Xs>0.

In the inorganic film according to the present invention, preferably, at least one of the refractive index gradient film A and the refractive index gradient film B comprises a complex oxide comprising Al, Zn, and Sn.

In the inorganic film according to the present invention, preferably, the refractive index gradient film A comprises a complex oxide comprising Al, Zn, and Sn, and the refractive index gradient film B comprises a complex oxide comprising Si, Zn, and Sn.

A laminate according to the present invention is a laminate wherein an inorganic film formed according to the present invention is formed on an organic film, and when a refractive index of the organic film is designated as n0, n0≤n1 is satisfied.

Preferably, in the laminate of the present invention, a resin layer is formed on the inorganic film, and when a refractive index of the resin layer is designated as n5, n4≥n5 is satisfied.

Advantageous Effects of Invention

The inorganic film and laminate of the present invention have the configurations as described above. In the refractive index gradient film h, the refractive index increases continuously from n1 to n2 in the film thickness direction, and further, in the refractive index gradient film B, the refractive index decreases continuously from n3 to n4, and the difference between n2 and n3 is 0.1 or less. Then, reflection due to refractive index difference is suppressed. Thus, a decrease in light transmittance can be prevented. Therefore, even if a material having a high refractive index that can provide various functions is used as the refractive index gradient film A and the refractive index gradient film B, a decrease in light transmittance can be prevented. Thus, both functionality and high light transmittance can be provided.

BRIEF DESCRIPTION OF DRAWINGS

FIG. 1 is a cross-sectional view showing a laminate having an inorganic film according to one embodiment of the present invention.

FIG. 2 is a cross-sectional view showing the refractive indices of the layers of the laminate shown in FIG. 1.

FIG. 3 is a diagram showing the configuration of one example of an apparatus used for forming the inorganic film of the present invention.

DESCRIPTION OF EMBODIMENT

A laminate using an inorganic film, in one embodiment of the present invention will be described with reference to the drawings. As shown, in FIG. 1, a planarizing layer 12 comprising organic material, a refractive index gradient film 13a comprising an inorganic material, a refractive index gradient film 13b comprising an inorganic material, and a resin layer 14 are laminated and integrated in the order on a substrate 11 to form a laminate. Here, the refractive index gradient film 13a as a refractive index gradient film A and the refractive index gradient film 13b as a refractive index gradient film B constitute an inorganic film 13 in this embodiment.

As shown in FIG. 2, in the refractive index gradient film 13a, n1 that is the refractive index of the surface in contact with the planarizing layer 12 increases continuously and monotonously to n2 that is the refractive index of the surface in contact with the refractive index gradient film 13b. In the refractive index gradient film 13b, n3 that is the refractive index of the surface in contact with the refractive index gradient film 13a decreases continuously and monotonously to n4 that is the refractive index of the surface in contact with the resin layer 14. Here, for the refractive indices of the layers, expressions n1<n2 and n3>n4 are satisfied. Further, the refractive index n2 and the refractive index n3 are equal in this embodiment, n2=n3.

However, the refractive index difference between n2 and n3 may be 0.1 or less. In this case, the change in refractive index at the interface between the refractive index gradient film 13a and the refractive index gradient film 13b can be decreased. Therefore, reflection due to refractive index difference can be suppressed, and a decrease in light transmittance can foe suppressed. This will be more specifically described below.

The refractive index gradient film 13a and the refractive index gradient film 13b are functional films. In this embodiment, as a function, high gas barrier properties are developed. Here, the gas barrier properties have the property of sufficiently reducing the transmission of gases such as carbon dioxide, oxygen, and water vapor.

In this embodiment, the refractive index gradient film 13a and the refractive index gradient film 13b have a structure in which the above refractive index changes continuously. At the interface between the refractive index gradient film 13a and the refractive index gradient film 13b, the refractive indices of both are high to some extent, but the refractive index difference is as small as 0.1 or less. Therefore, reflection due to refractive index difference can be suppressed. In addition, the above gas barrier properties can be sufficiently developed in the vicinity of the interface where the refractive index is relatively high.

On the other hand, the refractive index is low on the sides opposite to the interface, that is, the surfaces on the outside of the refractive index gradient film 13a and the refractive index gradient film 13b. Therefore, sufficient light transmission properties are ensured.

As described above, in the inorganic film obtained by laminating, as described above, the refractive index gradient films 13a and 13b in which as the refractive index increases, the function such as gas barrier properties increases, the gas barrier properties can be effectively increased in the portion where the refractive index is high. Moreover, the difference between n2 and n3 is 0.1 or less, and therefore, a decrease in light transmittance at the interface between both can also be suppressed.

The combination of the inorganic materials constituting the refractive index gradient film 13a and the refractive index gradient film 13b in which as the refractive index increases, the gas barrier properties increase, as described above, is not particularly limited as long as such a function is developed. Examples of the combination can include silicon oxide and zinc tin oxide, silicon oxide and aluminum zinc oxide, and aluminum oxide and zinc tin oxide.

In the laminate in this embodiment, the planarizing layer 12, the refractive index gradient film 13a, the refractive index gradient film 13b, and the resin layer 14 are laminated in the order on the substrate 11. Therefore, a sharp change in refractive index between the layers can be eliminated. Thus, reflection due to refractive index difference can be prevented. This antireflection effect can improve the light transmittance of the laminate.

When the refractive index change rates per film thickness of the refractive index gradient films 13a and 13b are defined as a refractive index change rate A=(n3 −n2)/t1 [t1=the film thickness of the gradient film A, unit: nm] and a refractive index change rate B=(n4−n5)/t2 [t2=the film thickness of the gradient film B, unit: nm], respectively, a refractive index change rate X desirably satisfies 0≤X<0.01/nm, more desirably 0≤X<0.006/nm. Here, when the refractive index change rate X that is a refractive index change per unit film thickness is more than 0.01/nm, optical interference due to a sudden refractive index change occurs, and a sufficient transmittance improvement effect is not obtained.

When the film thickness of the above laminate is t, the range of the value of the film thickness t is not particularly limited, but is preferably 30 nm≤t≤3000 nm, more preferably 50 nm≤t≤1000 ran, in order to obtain sufficient gas barrier properties.

The material constituting the substrate 11 of the gas barrier laminate is not particularly limited. Examples of the material include acrylic resins such as polymethyl methacrylate, polyethyl methacrylate, and polybutyl acrylate, polyester-based resins such as polyethylene terephthalate, polybutylene terephthalate, and isophthalate copolymers, and polyolefin-based resins such as polyethylene-based resins and polypropylene-based resins. Only one synthetic resin may be used, or two or more synthetic resins may be used in combination.

The material constituting the planarizing layer 12 comprising an organic layer is not particularly limited as long as the smoothness of the surface is obtained. For example, the material is obtained by making a composition comprising an alkoxysilane having a radical polymerizable group, an alkoxysilane having no radical polymerizable group, and water, applying the composition, and then, irradiating the above applied composition with active energy rays.

The thickness of the planarizing layer is preferably 0.01 to 100 μm, more preferably 0.1 to 50 μm, and particularly preferably 1 to 10 μm. When the thickness is less than 0.01 μm, sufficient gas barrier properties may not be provided. With a planarizing layer having a thickness of more than 100 μm, the rigidity is too high, which may decrease the handling properties of the gas barrier film.

For the refractive index gradient film 13a, 1) it may have a refractive index gradient structure in which the refractive index increases continuously and monotonously in the film thickness direction, 2) at the interface with the planarizing layer 12, the refractive index of the planarizing layer 12, n0, and the refractive index of the surface in contact with the planarizing layer 12, n1, may satisfy the condition of n0≤n1, and 3) the difference between the refractive index n2 nd the refractive index n3 may be 0.1 or less as described above.

The material constituting the refractive index gradient film 13a is not particularly limited as long as it comprises Zn, Sn, and at least one of Si and Al. The material may comprise, in addition to these materials, for example, an oxide or oxynitride of In, Ti, Mg, Zr, Ni, Ta, M, Cu, or an alloy comprising two or more of these. In terms of increasing gas barrier properties at high temperature, the refractive index gradient film 13a preferably comprises a complex oxide comprising Al, Zn, and Sn.

The value of n1 is preferably 1.7 or less, particularly preferably 1.6 or less, in order to decrease the refractive index difference between n1 and n0 that is organic material. The value of n2 is not particularly limited, but is preferably a value larger than 1.7, more preferably 1.8 or more, when the material is selected in order to obtain gas barrier properties.

For the refractive index gradient film 13b, 1) it may have a refractive index gradient structure in which the refractive index decreases continuously and monotonously in the film thickness direction, 2) at the interface with the resin layer 14, the refractive index of the surface in contact with the surface of the refractive index n5 of the resin layer 14, n4, may satisfy the condition of n4≥n5, and 3) the difference between the refractive index n2 and the refractive index n3 may be 0.1 or less as described above.

The material constituting the refractive index gradient film 13b is not particularly limited as long as it comprises Zn, Sn, and at least one of Si and Al. The material may comprise, in addition to these materials, for example, an oxide or oxynitride of In, Ti, Mg, Sr, Hi, Ta, W, Cu, or an alloy comprising two or more of these. In terms of increasing gas barrier properties at high temperature, the refractive index gradient film 13b preferably comprises a complex oxide comprising Al, Zn, and Sn.

The value of n4 is preferably 1.7 or less, particularly preferably 1.6 or less, in order to decrease the refractive index difference between n4 and the refractive index of the resin layer 14 that is organic material, n5.

The refractive index gradient film. 13a and the refractive index gradient film 13b may be composed of the same material or different materials. A functional, film having a refractive index equal to n2 or n3 may be formed between the refractive index gradient film 13a and the refractive index gradient film 13b. In other words, the refractive index gradient film 13a and the refractive index gradient film 13b may be indirectly laminated via a functional film or the like.

In the above inorganic film, the refractive index gradient film 13b may be laminated indirectly as described above, or in direct contact as described above, on the surface of the refractive index gradient film 13a on the side where the refractive index is n2 with the surface side where the refractive index is n3.

The resin layer 14 is not particularly limited and may be composed of organic material. Examples of the functions of the resin layer include planarization, stress relaxation, adhesiveness improvement, and lamination with another member. Examples thereof include ethylene-unsaturated carboxylic acid-acrylate copolymers, ethylene-unsaturated carboxylic acid-methacrylate copolymers, thermoplastic elastomers, low density polyethylene, ethylene-vinyl acetate copolymers, polyvinylidene chloride, ionomers, vinyl chloride-vinyl acetate copolymers, ethylene-vinyl alcohol copolymers, nitrocellulose, cellulose acetate, silicones, and polyurethane-based resins such as polyether polyurethanes that are condensates of diisocyanates and polyether polyols, and polyester polyurethanes that are condensates of diisocyanates and polyester polyols. Only one lamination material may be used, or two or more lamination materials may be used in combination.

Next, methods for forming the refractive index gradient film 13a and the refractive index gradient film 13b will be described. The methods for forming the refractive index gradient film 13a and the refractive index gradient film 13b are not particularly limited. Examples of the methods include physical vapor deposition (PVD) such as sputtering, evaporation, and ion plating and chemical vapor deposition (CVD). In these film formation methods, the film formation conditions may be changed so that the refractive index changes continuously. Therefore, the refractive index gradient film 13a and the refractive index gradient film 13b having a refractive index gradient structure can be formed. The methods for forming the refractive index gradient film 13a and the refractive index gradient film 13b may be the same, or different methods may be used.

In the above embodiment, the refractive index gradient film 13a and the refractive index gradient film 13b are functional films achieving gas barrier properties, but the function of the functional films in the present invention is not limited to gas barrier properties. In other words, functional films having a high refractive index and developing various functions can be used. Examples of such functions include transparent conductive films. Refractive index gradient films having high conductivity can be formed, for example, by using InSnO, AlZnO, and the like as materials.

In the present invention, as described above, in the refractive index gradient film A and the refractive index gradient film B, the refractive index is gradient so that the refractive index increases from the outside toward the interface between both, and the refractive index difference at the interface between both is as small as 0.1 or less, and therefore, on the outside surfaces, sufficient light transmission properties can be ensured by low refractive indices. In the vicinity of the interface between both, the difference between n2 and n3, that is, the refractive index difference, is small, and moreover, the refractive indices n2 and n3 themselves are high, and therefore, a good function can be developed, and a decrease in light transmittance can be suppressed.

One example of an application of the present invention can include a SiZnSnO gas barrier film. As the refractive index gradient film A and the refractive index gradient film 3, SiZnSnO films are formed with the Si content in the SiZnSnO films changed so as to decrease continuously toward the interface between both so that the refractive index is gradient so that the refractive index increases from the outside toward the interface between both.

In the SiZnSnO gas barrier film, the weight ratio Xs between Sn and the sum of Zn and Sn preferably satisfies 70>Xs>0, more preferably 50≥Xs>0, further preferably 30>Xs≥5, and most preferably 10≥Xs≥5 in order to obtain high gas barrier properties and bendability.

Another example of an application of the present invention can include an AlZnSnO gas barrier film. As the refractive index gradient film A and the refractive index gradient film B, AlZnSnO films are formed with the Al content in the AlZnSnO films changed so as to decrease continuously toward the interface between both so that the refractive index is gradient so that the refractive index increases from the outside toward the interface between both.

In the AlZnSnO gas barrier film, the weight ratio Xs between Sn and the sum of Zn and Sn preferably satisfies 50≥Xs>0, more preferably 50>Xs>0, further preferably 30≥Xs>0, and most preferably 30≥Xs≥10 in order to obtain high gas barrier properties and bendability.

In the present invention, it is possible to use an AlZnSnO gas barrier film as the refractive index gradient film A and a SiZnSnO gas barrier film as the refractive index gradient film B. In this case, the films are formed with the Si content in the SiZnSnO film or the Ai content in the AlZnSnO film changed so as to decrease continuously toward the interface between both so that the refractive index is gradient so that the refractive index increases from the outside toward the interface between both. However, in the present invention, it is possible to use a SiZnSnO gas barrier film as the refractive index gradient film A and an AlZnSnO gas barrier film as the refractive index gradient film B.

EXAMPLES

Next, Examples of the present invention will be described, but the present invention is not limited to the following Examples.

Example 1

As a laminate, a barrier film was fabricated. As the substrate of the barrier film, a PET film (manufactured by Toray Industries Inc., trade name: "Lumirror 50T60") was used.

<<Formation of Planarizing Layer>>

Next, 0.1 parts by weight of 2-methyl-1-[4-(methylthio)phenyl]2-morpholinopropan-1-one (manufactured by Ciba Specialty Chemicals, trade name: "IRGACURE 907") was added to a composition comprising 80 parts by weight of 3-methacryloxypropyltrimethoxysilane, 53 parts by weight of tetraethoxysilane, 30 parts by weight of titanium tetrabutoxide, and 4.9 parts by weight of water, and the composition was irradiated with ultraviolet rays for 15 minutes using a 9 W ultraviolet lamp for prepolymerization. This composition was applied to one surface of the above substrate by a gravure coater, and the applied composition was irradiated with electron beams under the conditions of an acceleration voltage of 175 kV and an irradiation dose of 150 kGy using an electron beam irradiation apparatus (manufactured by ESI, product name: "EC300/165/800") for the radical polymerization of 3-methacryloxypropyl trimethoxysilane to form a radical polymer. Then, the polyethylene terephthalate film having the composition subjected to electron beam irradiation on one surface was allowed to stand in an environment at 45° C. and a relative humidity of 65% RH for 1 hour to promote hydrolysis and a dehydration condensation reaction to form a dehydration condensation product of tetraethoxysilane crosslinking the main chain of the above radical polymer to obtain a planarizing layer (thickness 8 μm).

<<Method for Forming Inorganic Film>>

A gas barrier layer was formed using an R to R sputtering apparatus 31 shown in FIG. 3. This apparatus is composed of an unwinding and winding chamber 32 and a film formation chamber 40. The unwinding and winding chamber 32 is equipped with an unwinding shaft 33, a winding shaft 34, guide rolls 35 and 36, and a can roll 37 and is evacuated into a reduced pressure state by a vacuum pump 38. An original film that is a substrate is attached to the unwinding shaft 33, and a substrate film 30 unwound from the original film is wound around the winding shaft 34 through the guide roll 35, the can roll 37, and the guide roll 36. The film formation chamber 40 is equipped with targets 41 and 42 and connected to a bipolar power supply 43. Pulse power can be alternately supplied to the target 41 and the target 42 by this bipolar power supply 43. Further, an argon gas supply line 44 and an oxygen gas supply line 45 are connected to the film formation chamber 40, and argon gas and oxygen gas can be supplied into the film formation chamber 40. A vacuum pump 39 is also connected to the film formation chamber 40, and the pressure in the film formation chamber can be reduced. By supplying argon gas and oxygen gas at predetermined flow rates and further supplying power to the target 41 and the target 42 after the pressure reduction of the film formation chamber 40, plasma can be formed in the space between the targets and the can roll 37. The materials constituting the target 41 and the target 42 are sputtered from the surfaces of the targets by this plasma. Then, the sputtered materials are deposited on the surface of the substrate passing over the surface of the can roll 37 to form a thin film. The bipolar power supply 43 can arbitrarily control the ratio of the number of pulses supplied to the target 41 and the target 42. By controlling the ratio of the number of pulses, the ratio between the amount of the material sputtered from the surface of the target 41 and deposited on the substrate and the amount of the material sputtered from the surface of the target 42 and deposited on the substrate film 30 can be controlled. When different materials are selected as the target 41 and the target 42, the composition of the alloy oxide deposited on the substrate film 30 can be controlled by controlling the ratio of the number of pulses.

<<Formation of Refractive Index Gradient Film A>>

The substrate film on one surface of which the planarizing layer was formed was set on the unwinding shaft 33, and further, Si as the target 41 and a ZnSn alloy (Zn:Sn=70:30 wt %) target as the target 42 were attached. The R to R sputtering apparatus 31 was evacuated by the vacuum pump 38 and the vacuum pump 39 to reduce the pressure to $3.0 \times 10^{-4}$ Pa. Then, while the substrate film was conveyed through a path passing the guide roll 35, the can roll 37, and the guide roll 36 from the unwinding shaft 33 in the direction of the winding shaft 34, a SiZnSnO thin film was formed on the planarizing layer in the film formation chamber 40 under the conditions shown below to obtain a refractive index gradient film A.

(Film Formation Conditions A)

Substrate conveyance speed: 0.1 m/min, tension 100 N, can roll cooling temperature: 10° C.

Argon gas flow rate: 80 sccm, oxygen gas flow rate: 80 sccm

Power supply output: 5 kW, power pulse ratio: target 41:target 42=3:1

<<Formation of Refractive Index Gradient Film B>>

Next, while the substrate film on which the refractive index gradient film A was formed and which was wound around the winding shaft 34 was conveyed from the winding shaft 34 in the direction of the unwinding shaft 33, a SiZnSnO film was formed on the surface of the refractive index gradient film A under the conditions shown in the film formation conditions A to obtain a refractive index gradient film B.

<<Formation of Resin Layer>>

An adhesive material (manufactured by SEKISUI CHEMICAL CO., LTD., trade name: "Double Tack Tape," product number: 5405A, thickness 50 μm) was stuck on the surface of the refractive index gradient film B to obtain a resin layer.

<<Bonding of Weather-Resistant Resin Substrate>>

After the adhesive material was stuck, it was bonded to an ETFE (a copolymer of tetrafluoroethylene and ethylene) film, (manufactured by Asahi Glass Co., Ltd., trade name: "AFLEX," thickness 100 μm) to fabricate a gas barrier film 1.

Example 2

A gas barrier film 2 was fabricated as in Example 1 except that in the film formation conditions A for the refractive index gradient film A and the refractive index gradient film B, the substrate film conveyance condition was 0.075 m/min.

Example 3

A gas barrier film 3 was fabricated as in Example 1 except that in the film formation conditions A for the refractive index gradient film A and the refractive index gradient film B, the substrate film conveyance condition was 0.2 m/min.

Example 4

A gas barrier film 4 was fabricated as in Example 1 except that in the film formation conditions A for the refractive index gradient film A and the refractive index gradient film B, Si as the target 41 and a ZnSn alloy (Zn:Sn=90:10 wt %) target as the target 42 were attached.

Example 5

A gas barrier film 5 was fabricated as in Example 1 except that in the film formation conditions A for the refractive index gradient film A and the refractive index gradient film B, Si as the target 41 and a ZnSn alloy (Zn:Sn=95:5 wt %) target as the target 42 were attached.

Example 6

A gas barrier film 6 was fabricated as in Example 1 except that in the film formation conditions A for the refractive index gradient film A and the refractive index gradient film B, Si as the target 41 and a ZnSn alloy (Zn:Sn=30:70 wt %) target as the target 42 were attached.

Example 7

A gas barrier film 7 was fabricated as in Example 1 except that in the film formation conditions A for the refractive index gradient film A and the refractive index gradient film 3, Al as the target 41 and a ZnSn alloy (Zn:Sn=70:30 wt %) target as the target 42 were attached, and the substrate film conveyance condition was 0.05 m/min.

Example 8

A gas barrier film 8 was fabricated as in Example 1 except that in the film formation conditions A for the refractive index gradient film A and the refractive index gradient film B, Al as the target 41 and a ZnSn alloy (Zn:Sn=90:10 wt %) target as the target 42 were attached, and the substrate film conveyance condition was 0.05 m/min.

Example 9

A gas barrier film 9 was fabricated as in Example 1 except that in the film formation conditions A for the refractive index gradient film A and the refractive index gradient film B, Al as the target 41 and a ZnSn alloy (Zn:Sn=50:50 wt %) target as the target 42 were attached, and the substrate film conveyance condition was 0.05 m/min.

Example 10

A gas barrier film 10 was fabricated as in Example 1 except that in the film formation conditions A for the refractive index gradient film A and the refractive index gradient film B, the substrate film conveyance condition was 0.15 m/min.

Example 11

A gas barrier film 11 was fabricated as in Example 1 except that in the film formation conditions A for the refractive index gradient film A and the refractive index gradient film B, Si as the target 41 and a ZnSn alloy (Zn:Sn=50:50 wt %) target as the target 42 were attached.

Example 12

A gas barrier film 12 was fabricated as in Example 1 except that in the film formation conditions A for the refractive index gradient film A, Al as the target 41 and a ZnSn alloy (Zn:Sn=90:10 wt %) target as the target 42 were attached, and the substrate film conveyance condition was 0.05 m/min, and further, in the film formation conditions A for the refractive index gradient film B, Si as the target 41 and a ZnSn alloy (Zn:Sn=90:10 wt %) target as the target 42 were attached, and the substrate film conveyance condition was 0.15 m/min.

Comparative Example 1

A ZnSn alloy (Zn:Sn=70:30 wt %) was attached as the target 41 and the target 42. A ZnSnO film as a gas barrier layer was formed on a planarizing layer under the conditions shown in the film formation conditions B to fabricate a gas barrier film 13.

(Film Formation Conditions B)

Substrate conveyance speed: 0.1 m/min, tension 100 N, can roll cooling temperature: 10° C.

Argon gas flow rate: 80 sccm, oxygen gas flow rate: 80 sccm

Power supply output: 5 kW, power pulse ratio: target:target=1:1

(Gas Barrier Properties)

In order to evaluate the gas barrier properties of the obtained gas barrier film, the water vapor transmission rate was measured by a differential pressure type moisture permeability measuring apparatus (manufactured by GTR Tec Corporation, product number; GTR-300XASC) under the conditions of 40° C. and 90%.

(Transparency)

For the evaluation of the transparency of the gas barrier film, the total light transmittance was measured by a haze meter (manufactured by Toyo Seiki Seisaku-sho, Ltd., trade name: "Haze Guard 2") based on JIS K7361.

(Bendability)

The bendability of the gas barrier film was evaluated based on the bending resistance test shown in JIS C5016. The obtained gas barrier film was fixed to the fixed plate and movable plate of a bending resistance test apparatus so that the bending radius was 5 ram, and a test was performed with a stroke of 120 mm and a number of repeated bondings of 10000. The bendability was evaluated by the water vapor transmission rate after the test.

(Refractive Indices)

The refractive indices of the layers of the gas barrier film were measured by a reflection spectroscopic film thickness meter (manufactured by Otsuka Electronics Co., Ltd., FE-3000).

(Measurement of Sn Ratio)

Carbon was evaporated on a sample surface, and then, a thin film section was fabricated with FIB, and measurement, was performed by EDS analysis by a transmission electron microscope FE-TEM (manufactured by JEOL Ltd.: JEM-2010FEF).

(Evaluation Results)

The evaluation results of the gas barrier properties, transparency, and bendability are shown in Table 1 and Table 2.

[Evaluation Criteria for Gas Barrier Properties]
Water vapor transmission rate: WVTR (g/m²/day)

| WVTR range | Grade |
|---|---|
| $WVTR < 1.0 \times 10^{-3}$ | A |
| $1.0 \times 10^{-3} \leq WVTR < 5.0 \times 10^{-3}$ | B |
| $5.0 \times 10^{-3} \leq WVTR < 1.0 \times 10^{-2}$ | C |
| $WVTR \geq 1.0 \times 10^{-2}$ | D |

[Evaluation Criteria for Bendability]
Water vapor transmission rate after bending resistance test: B-WVTR (g/m²/day)

| B-WVTR range | Grade |
|---|---|
| $B\text{-}WVTR < 1.0 \times 10^{-3}$ | A |
| $1.0 \times 10^{-3} \leq B\text{-}WVTR < 5.0 \times 10^{-3}$ | B |
| $5.0 \times 10^{-3} \leq B\text{-}WVTR < 1.0 \times 10^{-2}$ | C |
| $B\text{-}WVTR \geq 1.0 \times 10^{-2}$ | D |

TABLE 1

| | | Refractive index | Ex. 1 | | Ex. 2 | | Ex. 3 | | Ex. 4 | |
|---|---|---|---|---|---|---|---|---|---|---|
| Configuration | Surface substrate | — | ETFE (100 μm) | | | | | | | |
| | Resin layer | n5 | Resin layer (50 μm n5 = 1.48) | | | | | | | |
| | Refractive index gradient gas barrier film B | n4 / n3 | SiZnSnO (150 nm) | n4 = 1.51, n3 = 1.96 | SiZnSnO (200 nm) | n4 = 1.51, n3 = 1.96 | SiZnSnO (75 nm) | n4 = 1.51, n3 = 1.96 | SiZnSnO (150 nm) | n4 = 1.51, n3 = 1.96 |
| | Refractive index gradient gas barrier film A | n2 / n1 | SiZnSnO (150 nm) | n2 = 1.96, n1 = 1.51 | SiZnSnO (200 nm) | n2 = 1.96, n1 = 1.51 | SiZnSnO (75 nm) | n2 = 1.96, n1 = 1.51 | SiZnSnO (150 nm) | n2 = 1.96, n1 = 1.51 |
| | Planarizing layer | n0 | Planarizing layer (8 μm, n0 = 1.47) | | | | | | | |
| | Substrate | — | PET (50 μm) | | | | | | | |
| | Refractive index change rate Xb | | 0.003 | | 0.002 | | 0.006 | | 0.003 | |
| | Refractive index change rate Xa | | 0.003 | | 0.002 | | 0.006 | | 0.003 | |
| | Sn ratio Xs | | 30 | | 30 | | 30 | | 10 | |
| Properties | Gas barrier properties | | B | | A | | C | | A | |
| | Transmittance | | 91.2 (○) | | 92.5 (○) | | 91 (○) | | 91.7 (○) | |
| | Bendability | | B | | A | | C | | A | |

| | | Refractive index | Ex. 5 | | Ex. 6 | | Ex. 7 | |
|---|---|---|---|---|---|---|---|---|
| Configuration | Surface substrate | — | ETFE (100 μm) | | | | | |
| | Resin layer | n5 | Resin layer (50 μm n5 = 1.48) | | | | | |
| | Refractive index gradient gas barrier film B | n4 / n3 | SiZnSnO (150 nm) | n4 = 1.51, n3 = 1.96 | SiZnSnO (150 nm) | n4 = 1.51, n3 = 1.96 | AlZnSnO (100 nm) | n4 = 1.67, n3 = 2.03 |
| | Refractive index gradient gas barrier film A | n2 / n1 | SiZnSnO (150 nm) | n2 = 1.96, n1 = 1.51 | SiZnSnO (150 nm) | n2 = 1.96, n1 = 1.51 | AlZnSnO (100 nm) | n2 = 2.03, n1 = 1.67 |
| | Planarizing layer | n0 | Planarizing layer (8 μm, n0 = 1.47) | | | | | |
| | Substrate | — | PET (50 μm) | | | | | |
| | Refractive index change rate Xb | | 0.003 | | 0.003 | | 0.0036 | |
| | Refractive index change rate Xa | | 0.003 | | 0.003 | | 0.0036 | |
| | Sn ratio Xs | | 5 | | 70 | | 30 | |
| Properties | Gas barrier properties | | A | | C | | A | |
| | Transmittance | | 91.3 (○) | | 91.2 (○) | | 90.2 (○) | |
| | Bendability | | A | | C | | A | |

*Xs = Sn/(Zn + Sn) (wt %)

TABLE 2

| | | Refractive index | Ex. 8 | | Ex. 9 | | Ex. 10 | |
|---|---|---|---|---|---|---|---|---|
| Configuration | Surface substrate | — | ETFE (100 μm) | | | | | |
| | Resin layer | n5 | Resin layer (50 μm n5 = 1.48) | | | | | |
| | Refractive index gradient gas barrier film B | n4 / n3 | AlZnSnO (100 nm) | n4 = 1.68, n3 = 2.03 | AlZnSnO (100 nm) | n4 = 1.67, n3 = 2.03 | SiZnSnO (100 nm) | n4 = 1.51, n3 = 1.96 |
| | Refractive index gradient gas barrier film A | n2 / n1 | AlZnSnO (100 nm) | n2 = 2.03, n1 = 1.68 | AlZnSnO (100 nm) | n2 = 2.03, n1 = 1.67 | SiZnSnO (100 nm) | n2 = 1.96, n1 = 1.51 |
| | Planarizing layer | n0 | Planarizing layer (8 μm, n0 = 1.47) | | | | | |
| | Substrate | — | PET (50 μm) | | | | | |
| | Refractive index change rate Xb | | 0.0036 | | 0.0036 | | 0.0045 | |
| | Refractive index change rate Xa | | 0.0036 | | 0.0036 | | 0.0045 | |
| | Sn ratio Xs | | 10 | | 50 | | 30 | |
| Properties | Gas barrier properties | | A | | B | | B | |
| | Transmittance | | 90.7 (○) | | 90.5 (○) | | 92.1 (○) | |
| | Bendability | | A | | B | | B | |

TABLE 2-continued

| | | Refractive index | Ex. 11 | | Ex. 12 | | Comp. Ex. 1 | |
|---|---|---|---|---|---|---|---|---|
| Configuration | Surface substrate | — | ETFE (100 μm) | | | | | |
| | Resin layer | n5 | Resin layer (50 μm n5 = 1.48) | | | | | |
| | Refractive index gradient gas barrier film B | n4 | SiZnSnO (150 nm) | n4 = 1.51 n3 = 1.96 | SiZnSnO (100 nm) | n4 = 1.51 n3 = 1.96 | ZnSnO (200 nm) | n = 1.98 |
| | | n3 | | | | | | |
| | Refractive index gradient gas barrier film A | n2 | SiZnSnO (150 nm) | n2 = 1.96 n1 = 1.51 | AlZnSnO (100 nm) | n2 = 2.03 n1 = 1.68 | | |
| | | n1 | | | | | | |
| | Planarizing layer | n0 | Planarizing layer (8 μm, n0 = 1.47) | | | | | |
| | Substrate | — | PET (50 μm) | | | | | |
| | Refractive index change rate Xb | | 0.003 | | 0.0036 | | — | |
| | Refractive index change rate Xa | | 0.003 | | 0.0045 | | | |
| | Sn ratio Xs | | 50 | | 10 | | 30 | |
| Properties | Gas barrier properties | | B | | A | | B | |
| | Transmittance | | 91.4 (○) | | 92.3 (○) | | 87.4 (X) | |
| | Bendability | | B | | A | | B | |

*Xs = Sn/(Zn + Sn) (wt %)

According to the Examples, because of the inorganic films having a refractive index gradient structure, the gas barrier films having higher transparency than the Comparative Example (single-layer film) were obtained. Further, by setting the ratio Xs (wt %) between Sn and the sum of Zn and Sn contained in the SiZnSnO film to 70>Xs>0, the gas barrier films having high gas barrier properties were obtained.

REFERENCE SIGNS LIST

11 . . . substrate
12 . . . planarizing layer
13 . . . inorganic film
13a . . . refractive index gradient film
13b . . . refractive index gradient film
14 . . . resin layer
30 . . . substrate film
31 . . . R to R sputtering apparatus
32 . . . unwinding and winding chamber
33 . . . unwinding shaft
34 . . . winding shaft
35 . . . guide roll
36 . . . guide roll
37 . . . can roll
38 . . . vacuum pump
39 . . . vacuum pump
40 . . . film formation chamber
41 . . . target
42 . . . target
43 . . . bipolar power supply
44 . . . argon gas supply line
45 . . . oxygen gas supply line

The invention claimed is:

1. An inorganic film comprising a refractive index gradient film A being composed of an inorganic material, having a refractive index changing continuously from n1 to n2 from one surface toward the other surface, and wherein n1<n2 and being a functional film; and a refractive index gradient film B being composed of an inorganic material, having a refractive index changing continuously from n3 to n4 from one surface toward the other surface, and wherein n4<n3 and being a functional film; the refractive index gradient film B being laminated on a surface of the refractive index gradient film A on a side where the refractive index is n2 with a surface side where the refractive index is n3 being in direct or indirect contact with the surface of the refractive index gradient film A; a difference between n2 and n3 being 0.1 or less;
the inorganic material being a complex oxide comprising Zn, Sn, and at least one of Si and Al.

2. The inorganic film according to claim 1, wherein at least one of the refractive index gradient film A and the refractive index gradient film B comprises a complex oxide comprising Si, Zn, and Sn.

3. The inorganic film according to claim 2, wherein in the complex oxide comprising Si, Zn, and Sn, a ratio Xs between Sn and a sum of Zn and Sn satisfies 70>Xs>0.

4. The inorganic film according to claim 1, wherein at least one of the refractive index gradient film A and the refractive index gradient film B comprises a complex oxide comprising Al, Zn, and Sn.

5. The inorganic film according to claim 1, wherein the refractive index gradient film A comprises a complex oxide comprising Al, Zn, and Sn, and the refractive index gradient film B comprises a complex oxide comprising Si, Zn, and Sn.

6. A laminate, wherein the inorganic film according to any one of claims 1 to 5 is formed on an organic film, and when a refractive index of the organic film is designated as n0, n0≤n1 is satisfied.

7. The laminate according to claim 6, wherein a resin layer is formed on the inorganic film, and when a refractive index of the resin layer is designated as n5, n4≥n5 is satisfied.

* * * * *